United States Patent
Braun et al.

(10) Patent No.: US 6,440,827 B2
(45) Date of Patent: Aug. 27, 2002

(54) METHOD FOR FABRICATING A SEMICONDUCTOR COMPONENT HAVING A WIRING WHICH RUNS PIECEWISE IN THE SUBSTRATE, AND ALSO A SEMICONDUCTOR COMPONENT WHICH CAN BE FABRICATED BY THIS METHOD

(75) Inventors: Helga Braun; Ronald Kakoschke; Regina Stokan, all of München; Andreas Kux, Haar, all of (DE); Gunther Plasa, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/853,521

(22) Filed: May 11, 2001

Related U.S. Application Data

(63) Continuation of application No. PCT/DE99/03603, filed on Nov. 11, 1999.

(30) Foreign Application Priority Data

Nov. 11, 1998 (DE) .......................... 198 52 072

(51) Int. Cl.[7] .......................................... H01L 21/425
(52) U.S. Cl. ........................................ 438/529; 438/228
(58) Field of Search ................................ 438/514, 527, 438/529, 228

(56) References Cited

U.S. PATENT DOCUMENTS

| 4,583,011 A | 4/1986 | Pechar ...................... 307/440 |
| 5,985,727 A | * 11/1999 | Burr .......................... 438/302 |

FOREIGN PATENT DOCUMENTS

| DE | 1 614 250 | 8/1970 |
| DE | 16 14 250 | 11/1977 |
| DE | 32 00 953 A1 | 8/1982 |
| DE | 35 02 713 A1 | 7/1986 |
| DE | 31 43 565 A1 | 5/1993 |
| EP | 0 585 601 A1 | 3/1994 |
| EP | 0 764 985 A2 | 3/1997 |
| JP | 63 129647 | 6/1988 |
| JP | 2 237038 | 9/1990 |

* cited by examiner

Primary Examiner—John F. Niebling
Assistant Examiner—Christopher Lattin
(74) Attorney, Agent, or Firm—Laurence A. Greenberg; Werner H. Stemer; Gregory L. Mayback

(57) ABSTRACT

A method for fabricating a wiring which runs at least piecewise in a substrate. At least one conductive connection runs in the semiconductor substrate and at least one conductive connection runs on the semiconductor substrate being provided. The semiconductor component enables applications in which high security against external manipulations is important.

13 Claims, 4 Drawing Sheets

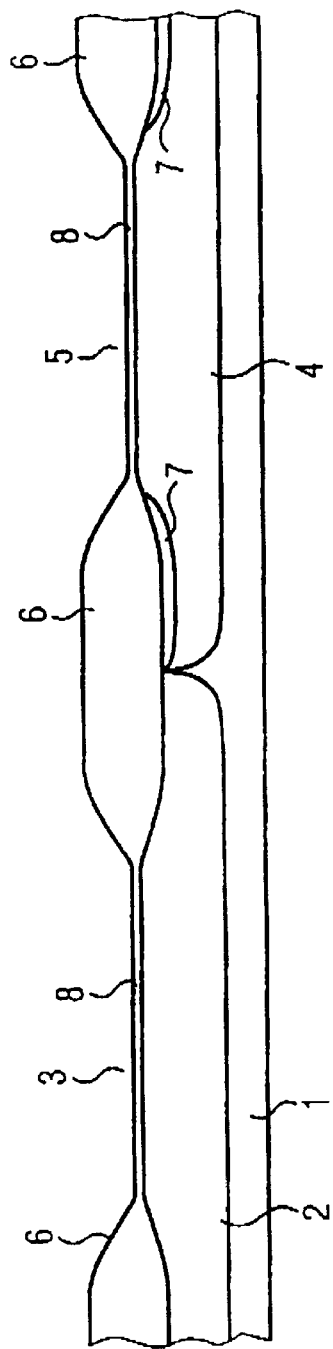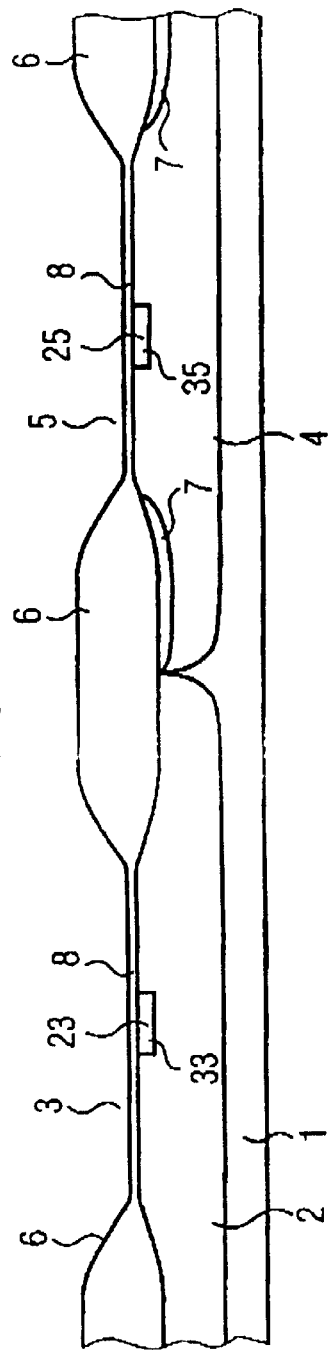

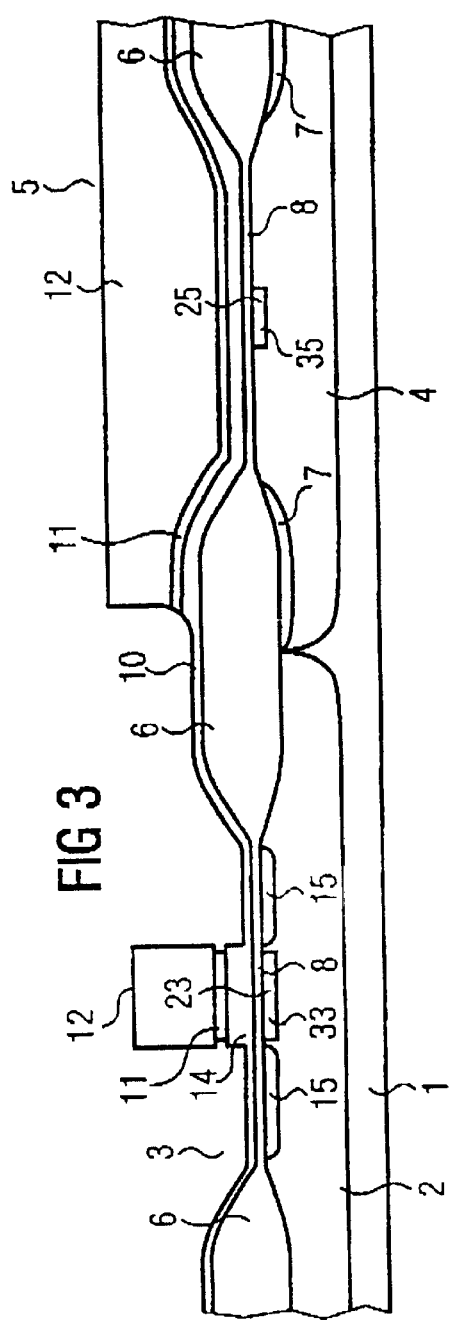
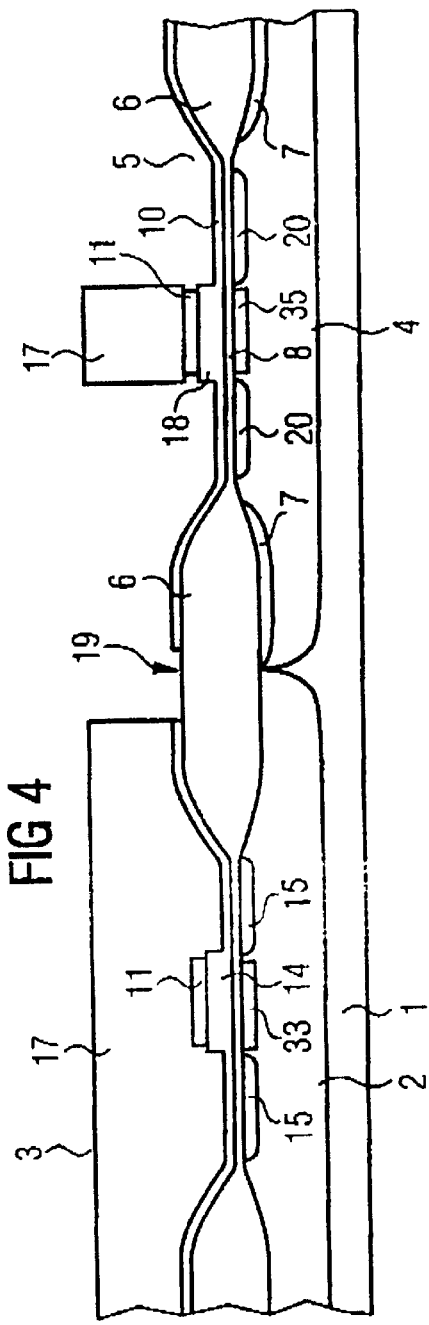

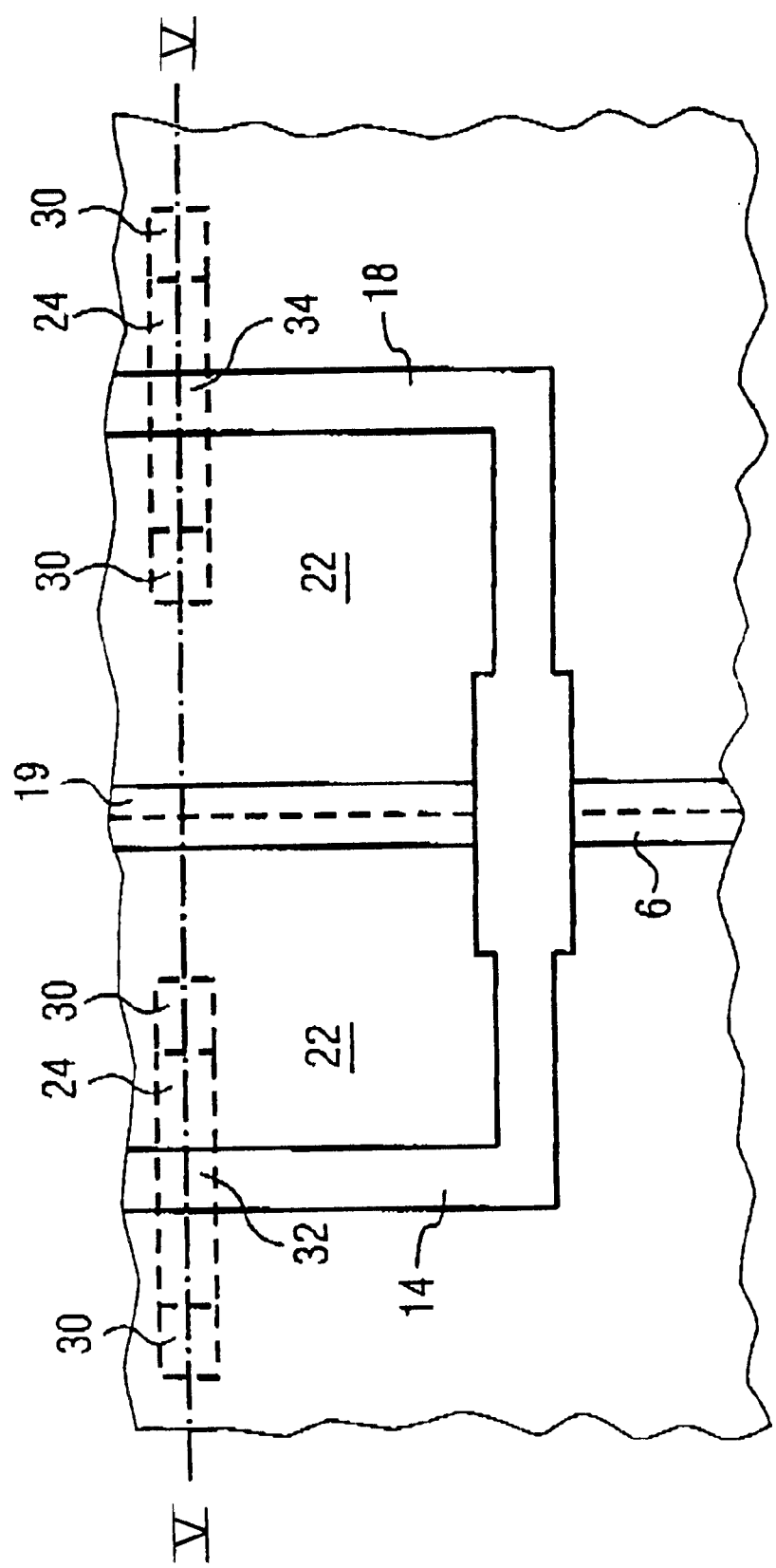

METHOD FOR FABRICATING A SEMICONDUCTOR COMPONENT HAVING A WIRING WHICH RUNS PIECEWISE IN THE SUBSTRATE, AND ALSO A SEMICONDUCTOR COMPONENT WHICH CAN BE FABRICATED BY THIS METHOD

CROSS-REFERENCE TO RELATED APPLICATION

This application is a continuation of copending International Application No. PCT/DE99/03603, filed Nov. 11, 1999, which designated the United States.

BACKGROUND OF THE INVENTION

FIELD OF THE INVENTION

The invention relates to a method for fabricating a semiconductor component having a wiring that runs piecewise in the substrate, and also a semiconductor component that can be fabricated by this method. Semiconductor components having wirings which run partly in the substrate are disclosed for example in Published, Non-Prosecuted German Patent Application DE 35 02 713 A1 and in German Patent DT 16 14 250 B2.

Integrated circuits, in particular CMOS circuits, are fabricated by a multiplicity of process steps. In this case, the fabrication costs of the circuits are determined by the process complexity and the physical processing time. Highly complex modules often require several hundred individual process steps and many days for the process cycle of the product.

In this case, some of the process steps must be used for producing the wiring that connects the individual active components to one another or ensures the connection of the integrated circuit to the "outside world". Usually, such connections are realized by one or more interconnect planes made of aluminum.

There are applications, however, in which an interconnect plane made of aluminum is too expensive and requires too much space. Furthermore, integrated circuits realized with an aluminum wiring are not sufficiently protected against external manipulation or the subsequent analysis of a circuit.

In order to be able to perform manipulations on an integrated circuit, as a rule it is necessary to analyze the integrated circuit. To that end, a passivation layer and/or the insulation layers between the wiring planes have to be stripped off layer by layer in order that the wiring planes thus uncovered can be examined. If the wiring planes are present as aluminum wiring, then a circuit analysis of this type can be carried out in a relatively simple manner.

SUMMARY OF THE INVENTION

It is accordingly an object of the invention to provide a method for fabricating a semiconductor component having a wiring which runs piecewise in the substrate, and also a semiconductor component which can be fabricated by the method that overcome the above-mentioned disadvantages of the prior art methods and devices of this general type, in which the analysis of the integrated circuit and also the subsequent manipulation thereof are made significantly more difficult. Furthermore, the method for producing such a wiring should be adapted as well as possible to the method for fabricating the transistors and require as few additional process steps as possible.

With the foregoing and other objects in view there is provided, in accordance with the invention, a method for fabricating a semiconductor component and the method being adapted from a further method for fabricating at least two MOS transistor types. The method includes providing a semiconductor substrate having at least one first zone of a second conductivity type for transistors of a first transistor type and a second zone of a first conductivity type for transistors of a second transistor type. A first insulating layer is applied to the semiconductor substrate. A first dopant of the first conductivity type is introduced into the first zone in a first region of a crossover point between a yet to be formed first conductive connection running in the semiconductor substrate and a yet to be formed second conductive connection running on the semiconductor substrate. A second dopant of the second conductivity type is introduced into the second zone in a second region of a crossover point between the yet to be formed first conductive connection and a yet to be formed third conductive connection running on the semiconductor substrate. A conductive layer is applied to the first insulating layer from which the second conductive connection and the third conductive connection are to be formed from. A first mask is applied using a phototechnology process. The first mask covers the second zone substantailly completely and, in the first zone covers only gate tracks of the transistors of the first transistor type that are to be produced and also an area of the conductive layer forming the second conductive connection running on the semiconductor substrate. The first mask is used for fully removing first areas of the conductive layer or removing only some of the conductive layer in the first areas forming first partially remaining areas functioning as an insulation layer. At least one third dopant of the first conductivity type is introduced into the semiconductor substrate. A second mask is applied using the phototechnology process. The second mask covers the first zone substantially completely and, in the second zone covers only gate tracks of the transistors of the second transistor type that are to be produced and parts of the conductive layer forming the third conductive connection running on the semiconductor substrate. The second mask is used for fully removing second areas of the conductive layer or partially removing some of the conductive layer in the second areas forming second partially remaining areas functioning as an addition part of the insulation layer. At least one fourth dopant of the second conductivity type is introduced into the semiconductor substrate. A temperature is increased so that the first conductive connection running in the semiconductor substrate is formed by regions impregnated by the first dopant, the second dopant, the third dopant and the fourth dopant. The first conductive connection, the second conductive connection and the third conductive connection define wiring running in and on the semiconductor substrate.

The method steps need not necessarily be carried out in the order specified; in particular, the order of the second and third and fourth steps can also be interchanged. With the semiconductor component according to the invention that is fabricated in this way, it is possible to realize low-resistance underpasses below the gate plane, as a result of which a subsequent circuit analysis is made significantly more difficult. The semiconductor component according to the invention thus enables applications in which high security against external manipulations is important.

The method according to the invention furthermore has the advantage that, for producing at least two transistor types, for example PMOS and NMOS transistors, and also the wiring running in the substrate, it only requires three photoplanes, whereas the conventional fabrication methods usually require six or more photoplanes. In the case of the method according to the invention, the masks produced using the phototechnology process serve, in the respective zone, both for patterning the gate tracks or the connections running on the substrate and for introducing the dopant in order to produce the source/drain zones or the connections running in the substrate. By virtue of the saving of three photoplanes, the process sequence is in turn significantly simplified and accelerated, so that cost-effective production can be ensured. Integrated circuits of this type can thus likewise be used in applications in which low fabrication costs, in particular, are important.

In the case of the method according to the invention, it is particularly preferred if a region (or regions) which is (are) not covered by both masks is provided between the first and second zones. This ensures that, in the plane of the conductive layer, only the connections actually provided produce a conductive connection between the first and second zones.

Furthermore, it is preferred if a protective layer, in particular an oxide-nitride-oxide layer, is applied to the conductive layer and is removed after the application of the masks in accordance with the masks.

Likewise, it is preferred if the conductive layer is a polysilicon layer.

In accordance with one embodiment of the present invention, the polysilicon layer is converted by oxidation into the second insulating layer. In this case, it is particularly preferred if the polysilicon layer is converted into the second insulating layer by part of the polysilicon layer being removed and the remaining part being converted by oxidation into a silicon oxide layer.

Furthermore, it is preferred if the dopant is introduced into the semiconductor substrate by implantation with subsequent thermal treatment. In this case, in particular, the elevated process temperature occurring during the oxidation of the polysilicon layer can be used for driving in the dopant.

Furthermore, it is preferred if the first and the second zone each have regions provided for substrate contacts, the first mask has openings above the regions in the second zone which are provided for substrate contacts, and covers regions in the first zone which are provided for substrate contacts, and the second mask has openings above the regions in the first zone which are provided for substrate contacts, and covers regions in the second zone which are provided for substrate contacts.

Furthermore, it is preferred if in the predetermined zones in which the transistors to be produced are intended to be disposed, insulation zones, in particular Locos isolations or shallow trench isolations, are provided, which delimit the transistors.

With the foregoing and other objects in view there is provided, in accordance with the invention, a semiconductor component containing a semiconductor substrate having at least one first zone of a second conductivity type for transistors of a first transistor type and a second zone of a first conductivity type for transistors of a second transistor type. A first insulating layer is disposed on the semiconductor substrate. A first dopant of the first conductivity type is introduced into the first zone in a first region. A first conductive connection is disposed on the first insulating layer and runs above the first region. A second dopant of the second conductivity type is introduced into the second zone in a second region. A second conductive connection is disposed on the first insulating layer and runs above the second region. At least one third dopant of the first conductivity type is introduced into the semiconductor substrate. A second insulation layer is disposed on the first insulation layer. At least one fourth dopant of the second conductivity type is introduced into the semiconductor substrate. Regions impregnated by the first dopant, the second dopant, the third dopant and the fourth dopant form a third conductive connection due to a heat treatment step. The first conductive connection, the second conductive connection and the third conductive connection define wiring running in and on the semiconductor substrate.

Other features which are considered as characteristic for the invention are set forth in the appended claims.

Although the invention is illustrated and described herein as embodied in a method for fabricating a semiconductor component having a wiring which runs piecewise in the substrate, and also a semiconductor component which can be fabricated by this method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1 to 5 are diagrammatic, cross-sectional views through different stages of a method according to the invention; and FIGS. 6 and 7 are plan views of the structure shown in cross section in FIG. 4.

DESCRIPTION OF THE PREFERRED EMBODIMENTS

Figure 5:
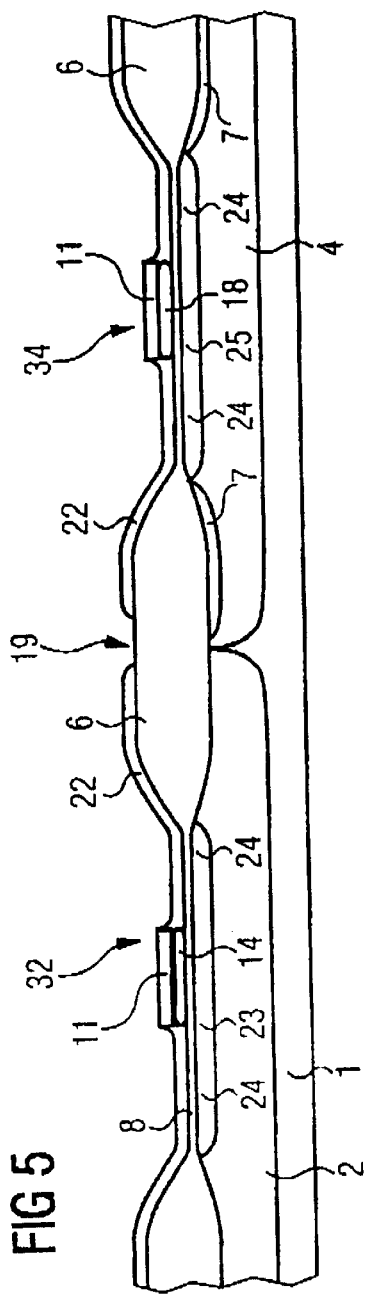

In all the figures of the drawing, sub-features and integral parts that correspond to one another bear the same reference symbol in each case. Referring now to the figures of the drawing in detail and first, particularly, to FIG. 1 thereof, there is shown a semiconductor substrate 1 which is provided as the starting point for the method according to the invention. An n-conducting well 2 is provided in the p-conducting semiconductor substrate 1. The extent of the n-type well 2 thus defines a first zone 3, which later receives a p-type diffusion as a conductive connection. Furthermore, a p-conducting well 4 is provided in the semiconductor substrate 1. The extent of the p-type well 4 thus likewise defines a second zone 5, which later receives an n-type diffusion as a conductive connection. Furthermore, Locos isolations 6 are provided, which laterally insulate individual connections from one another. In order to improve the insulation, there may also be field implantations 7 below the Locos isolations 6.

On the semiconductor substrate 1 that was prepatterned in this way, an oxide layer 8 was applied to the semiconductor substrate 1 as an insulation layer between the Locos isolations 6. The oxide layer 8 serves hereafter in other regions of the semiconductor substrate 1 as a gate oxide for non-illustrated transistors that are yet to be produced. The resulting structure is shown in FIG. 1.

By a phototechnology process, boron atoms 33 are then implanted into the n-conducting well 2 of the semiconductor substrate 1 (implantation energy 20 keV, implantation dose $2*10^{14}$ cm$^{-2}$). In this case, the boron atoms are implanted into a region 23 which will later form the crossover point between a conductive connection 24 running in the semiconductor substrate and a conductive connection 14 running on the semiconductor substrate (see FIG. 6).

By a further phototechnology process, phosphorus atoms 35 are implanted into the p-conducting well 4 of the semiconductor substrate 1 (implantation energy 20 keV, implantation dose $2*10^{14}$ cm$^{-2}$). In this case, the phosphorus atoms 35 are implanted into a region 25 which will later form the crossover point between the conductive connection 24 running in the semiconductor substrate and a further conductive connection 18 running on the semiconductor substrate (see FIG. 6). The resulting situation is shown in FIG. 2.

Afterward, by a chemical vapor deposition (CVD) process, a polysilicon layer 10 is applied as a conductive layer to the oxide layer 8 and the Locos isolation 6. In this case, the polysilicon layer 10 has, for example, a thickness of 150 nm and an n$^+$-type doping of 2.0 $10^{20}$cm$^{-3}$. The doping can be effected insitu during the deposition, by a subsequent implantation or by a so-called POCL coating. An oxide-nitride layer 11 is then deposited onto the polysilicon layer 10, the oxide-nitride-oxide layer 11 subsequently being produced as a protective layer by oxidation from the oxide-nitride layer 11.

By a phototechnology process, a first mask 12 is then applied to the oxide-nitride-oxide layer 11. In this case, the first mask 12 covers essentially only the conductive connection 14 above the n-type well 2, while the p-type well 4 is virtually completely covered by the first mask 12.

Above a region 19 (see FIG. 4) between the two wells 2 and 4, the first mask 12 is drawn back somewhat, so that the region 19 is also not covered by the first mask 12.

In accordance with the first mask 12, the uncovered parts of the oxide-nitride-oxide layer 11 are removed by etching. Furthermore, in accordance with the first mask 12, the uncovered part of the polysilicon layer 10 is removed up to a predetermined thickness. Finally, in accordance with the first mask 12, boron atoms 15 are implanted into the semiconductor substrate 1 and the Locos isolation 6 (implantation energy 20 keV, implantation dose $2*10^{15}$ cm$^{-2}$). Since the boron atoms 15 implanted into the Locos isolation 6 do not subsequently play a significant part, only the boron atoms 15 implanted into the semiconductor substrate 1 are shown in FIG. 3.

In this case, the first mask 12 could be removed as early as after the patterning of the protective layer 11 or after the patterning of the polysilicon layer 10 being a conductive layer 10, but it is preferred for the first mask 12 to be left until the dopant implantation has been concluded. In this way, it is possible to use a relatively thin conductive layer that entails only minor topology differences on the substrate surface.

Once the boron implantation has been concluded, the first mask 12 is removed, and a second mask 17 is applied by a further phototechnology process. In this case, the second mask 17 covers only the conductive connection 18 above the p-type well 4, while the n-type well 2 is almost completely covered.

Above the region 19 (see FIG. 4) between the two wells 2 and 4, the second mask 17 is drawn back somewhat, so that the region 19 is not covered by the second mask 17.

In accordance with the second mask 17, those parts of the oxide-nitride-oxide layer 11 which are still present and are now uncovered are removed by etching. Furthermore, in accordance with the second mask 17, that part of the polysilicon layer 10 which is still present and is uncovered is removed up to a predetermined thickness. This has the result, inter alia, that the polysilicon layer 10 is completely removed in the region 19 between the first and the second zone which was not covered by both masks.

Finally, in accordance with the second mask 17, phosphorus and/or arsenic atoms 20 are implanted into the semiconductor substrate 1 and the Locos isolation 6 (phosphorus: implantation energy 130 keV, implantation dose $1*10^{14}$ cm$^{-2}$; arsenic: implantation energy 150 keV, implantation dose $2* 10^{15}$ cm$^{-2}$). Since the dopant atoms 20 implanted into the Locos isolation 6 do not subsequently play a significant part, only the dopant atoms 20 implanted into the semiconductor substrate 1 are shown in FIG. 4.

Once the phosphorus/arsenic implantation has been concluded, the second mask 17 is removed and the polysilicon 10 that has still remained and is not protected by the protective layer 11 is then oxidized, so that an oxide layer 22 is produced as second insulation layer 22. The conductive connections 14, 18 covered by the oxide-nitride-oxide layer 11 are not oxidized in the process. The oxidation of the polysilicon layer 10 takes place, for example, in a humid atmosphere at a temperature of about 950° C. for 80 min. The elevated temperature is simultaneously utilized to drive the dopants boron 15 and phosphorus/arsenic 20, respectively, into the semiconductor substrate 1, in order thus to produce the conductive connections 24 running in the semiconductor substrate 1.

In this case, the concentration of the dopants is chosen such that the conductive connections 24 running in the semiconductor substrate 1 have a sufficient conductivity in the regions 23, 25 of crossover points 32, 34. This prevents transistors from being formed at the crossover points 32, 34. The resulting situation is shown in FIG. 5.

In accordance with a further embodiment of the method according to the invention, during etching the polysilicon layer 10 is removed not only up to a predetermined thickness but completely. The consequence of this is that a long oxidation step for converting the residual polysilicon is no longer necessary. In this case, only a relatively short thermal treatment is carried out in order to drive the dopants into the semiconductor substrate (950° C. for about 20 min).

Figure 6:
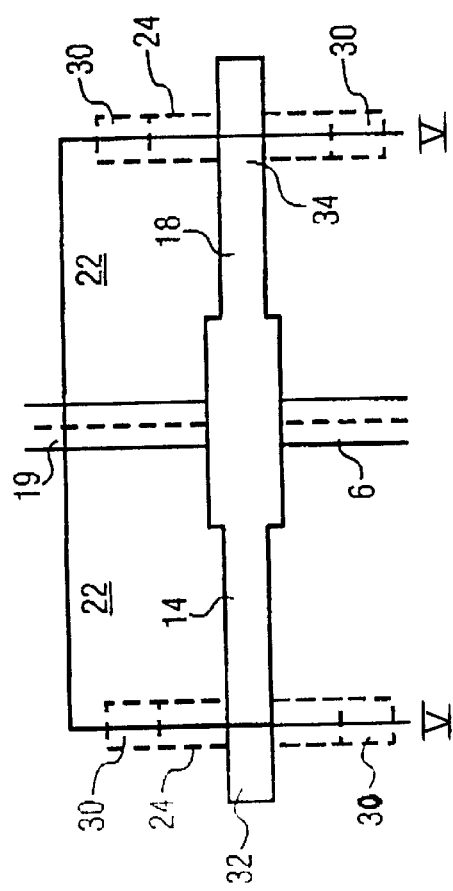

FIG. 6 shows a plan view of the structure shown in cross section in FIG. 5. The structure shown in FIG. 5 emerges through a section taken along the line V—V in FIG. 6 and subsequent folding out.

It is evident that the conductive connections or gate tracks 14 and 18 constitute a conductive connection that runs on the semiconductor substrate 1 and connects for example gate electrodes of two transistors (not shown) to one another. In contrast, the conductive connections or diffusion zones 24, which are contact-connected through contact holes at locations 30 in a later method step, constitute the conductive connection running in the semiconductor substrate 1.

If somebody now attempts to analyze an integrated circuit fabricated in this way, the wiring shown in plan view in FIG. 6 appears to him as a configuration of two transistors in CMOS technology. The difference is apparent only through the doping concentration in the regions 23 and 25. However, the doping concentration can subsequently be ascertained only with a very high outlay. Therefore, a subsequent circuit analysis will not lead to the correct circuit. Therefore, the subsequent manipulation of the integrated circuit is also made significantly more difficult.

FIG. 7 shows, likewise in plan view, a configuration according to the invention in which the diffusion zones 24 lie on a line. The line is straight here, in contrast to FIG. 6. By contrast, the gate tracks 14, 18 are disposed at an angle with respect to one another.

There then follows a deposition of a further insulation layer, for example BPSG, and of a further conductive layer, for example aluminum, in order to form a first metallization plane. Depending on the complexity of the circuit to be fabricated, further insulation layers and further conductive layers can be applied. However, for simple circuits, one metallization plane is generally sufficient, so that a passivation layer can then be deposited.

We claim:

1. A method for fabricating a semiconductor component and the method being adapted from a further method for fabricating at least two MOS transistor types, which comprises the steps of:

provding a semiconductor substrate having at least one first zone of a second conductivity type for transistors of a first transistor type and a second zone of a first conductivity type for transistors of a second transistor type;

applying a first insulating layer to the semiconductor substrate;

introducing a first dopant of the first conductivity type into the first zone in a first region of a crossover point between a yet to be formed first conductive connection running in the semiconductor substrate and a yet to be formed second conductive connection running on the semiconductor substrate;

introducing a second dopant of the second conductivity type into the second zone in a second region of a crossover point between the yet to be formed first conductive connection and a yet to be formed third conductive connection running on the semiconductor substrate;

applying a conductive layer to the first insulating layer from which the second conductive connection and the third conductive connection are to be formed from;

applying a first mask using a phototechnology process, the first mask covering the second zone substantailly completely and, in the first zone covering only gate tracks of the transistors of the first transistor type that are to be produced and also an area of the conductive layer forming the second conductive connection running on the semiconductor substrate;

using the first mask for one of fully removing first areas of the conductive layer and removing only some of the conductive layer in the first areas forming first partially remaining areas functioning as an insulation layer;

introducing at least one third dopant of the first conductivity type into the semiconductor substrate;

applying a second mask using the phototechnology process, the second mask covering the first zone substantially completely and, in the second zone covering only gate tracks of the transistors of the second transistor type that are to be produced and parts of the conductive layer forming the third conductive connection running on the semiconductor substrate;

using the second mask for one of fully removing second areas of the conductive layer and partially removing some of the conductive layer in the second areas forming second partially remaining areas functioning as an addition part of the insulation layer;

introducing at least one fourth dopant of the second conductivity type into the semiconductor substrate;

increasing a temperature so that the first conductive connection running in the semiconductor substrate is formed by regions impregnated by the first dopant, the second dopant, the third dopant and the fourth dopant, the first conductive connection, the second conductive connection and the third conductive connection defining wiring running in and on the semiconductor substrate.

2. The method according to claim 1, which comprises providing a third region, which is not covered by the first mask or the second mask, between the first zone and the second zone.

3. The method according to claim 1, which comprises applying a protective layer to the conductive layer and removing parts of the protective layer after an application of the first mask and the second mask.

4. The method according to claim 3, which comprises forming the protective layer as an oxide-nitride-oxide layer.

5. The method according to claim 1, which comprises forming the conductive layer as a polysilicon layer.

6. The method according to claim 5, which comprises converting the first partially remaining areas and the second partially remaining areas of the polysilicon layer by oxidation into the second insulating layer.

7. The method according to claim 5, which comprises converting the first partially remaining areas and the second partially remaining areas of the polysilicon layer into the second insulating layer by oxidation resulting in a silicon oxide layer being the second insulating layer.

8. The method according to claim 5, which comprises introducing the third dopant and the fourth dopant into the semiconductor substrate by an implantation process with a subsequent thermal treatment process.

9. The method according to claim 8, which comprises driving the third dopant and the fourth dopant into the semiconductor substrate by an elevated temperature during an oxidation of the polysilicon layer.

10. The method according to claim 1, which comprises:

providing the first zone and the second zone with further regions provided for substrate contacts;

forming the first mask with openings above the further regions in the second zone which are provided for the substrate contacts, and the first mask covers the further regions in the first zone which are provided for the substrate contacts; and forming the second mask with openings above the further regions in the first zone which are provided for the substrate contacts, and the second mask covers the further regions in the second zone which are provided for the substrate contacts.

11. The method according to claim 1, which comprises applying an insulation zone between the first zone and the second zone in which the transistors to be produced are intended to be disposed, and the insulation zone delimits the transistors.

12. The method according to claim 11, which comprises forming the insulation zone as a Locos isolation zone.

13. The method according to claim 11, which comprises forming the insulation zone as a shallow trench isolation zone.

* * * * *